United States Patent [19]
Turturro

[11] Patent Number: 5,883,783
[45] Date of Patent: Mar. 16, 1999

[54] GT CLIP DESIGN FOR AN ELECTRONIC PACKAGING ASSEMBLY

[75] Inventor: Gregory Turturro, Chandler, Ariz.

[73] Assignee: Intel Corporation, Santa Clara, Calif.

[21] Appl. No.: 893,937

[22] Filed: Jul. 15, 1997

[51] Int. Cl.[6] ................................................ H05K 7/20
[52] U.S. Cl. ........................ 361/704; 165/80.3; 257/719
[58] Field of Search ............................. 24/458; 165/86.2, 165/86.3, 185; 174/16.3, 138 G; 248/316.7, 510; 267/150, 160, 158; 357/707, 712–713, 718–719, 725, 726–727; 361/697, 704, 707, 709–711, 717–720, 722, 742

[56] References Cited

U.S. PATENT DOCUMENTS

| | | | |
|---|---|---|---|
| 4,658,331 | 4/1987 | Berg | 361/719 |
| 5,305,185 | 4/1994 | Samaruu et al. | 257/719 |
| 5,557,503 | 9/1996 | Isaacs et al. | 361/719 |
| 5,662,163 | 9/1997 | Mira | 361/720 |

*Primary Examiner*—Gregory Thompson
*Attorney, Agent, or Firm*—Blakely, Sokoloff, Taylor & Zafman LLP

[57] ABSTRACT

An electrical assembly which includes a clip that couples a thermal element to an integrated circuit package. The integrated circuit package is mounted to a printed circuit board. An elastomer is located between the printed circuit board and the clip. The assembly is designed so that the elastomer applies a pre-load force which pulls the thermal element into the integrated circuit package. The pre-load is typically set so that the thermal element does not become separated from the package when the assembly is subjected to external shock and vibration loads. The elastomer applies the pre-load force uniformly along the area of contact with the printed circuit board. The elastomer does not create localized high stress points on the board. Additionally, the elastomer has an inner opening that is larger than the outer dimensions of the integrated circuit package so that the elastomer applies the pre-load force onto the board in an area away from the solder joints of the package.

11 Claims, 1 Drawing Sheet

GT CLIP DESIGN FOR AN ELECTRONIC PACKAGING ASSEMBLY

BACKGROUND OF THE INVENTION

1. Field of the Invention

The present invention relates to a clip assembly that couples a thermal element to an integrated circuit package and a printed circuit board.

2. Description of Related Art

FIG. 1 shows an electrical assembly of the prior art sold by Intel Corp. The assembly includes an integrated circuit package 1 that is soldered to a printed circuit board 2. The package 1 contains an integrated circuit (not shown) which generates heat. The assembly is provided with a thermal element 3 to facilitate the removal of heat from the package 1. The thermal element 3 is typically a heat sink which has a plurality of pins 4 that extend through the printed circuit board 2. The thermal element 3 is fastened to the circuit board 2 by a spring 5 that is attached to the pins 4. There are typically two springs in the assembly. The assembly is designed so that the springs 5 have a pre-load which pulls the thermal element 3 into the package 1. A thermal grease (not shown) is typically located between integrated circuit package 1 and the thermal element 3 to minimize the thermal impedance between the two components 1 and 3.

The assembly is typically incorporated into to a computer which may be subjected to external shock and vibration loads. It has been found that such external loads may create a physical separation between the thermal element 3 and the package 1. Any separation will increase the thermal impedance between the element 3 and the package 1 and increase the junction temperatures of the integrate circuit. Additionally, relative movement between the thermal element 3 and the package 1 may "pump" the thermal grease out of the thermal interface. The reduction in thermal grease also increases the thermal impedance of the package/thermal element interface and the junction temperatures of the integrated circuit.

The assembly is designed so that the springs 5 apply a pre-load which pulls the thermal element 3 into the integrated circuit package 1. The pre-load forces F are transferred into the printed circuit board 2 through a pair of support points of each spring 5. The load transfer points are located beneath the integrated circuit package 1. These point loads create localized high stress points which can crack some of the solder joints of the package. Cracked solder joints may create electrical shorts which effect the operation of the integrated circuit. It would be desirable to modify the assembly shown in FIG. 1 to prevent separation between the thermal element and the integrated circuit package and to minimize the stresses on the solder joints of the package.

SUMMARY OF THE INVENTION

An electrical assembly which includes a clip that couples a thermal element to an integrated circuit package. The integrated circuit package is mounted to a printed circuit board. An elastomer is located between the printed circuit board and the clip.

DETAILED DESCRIPTION OF THE INVENTION

In one embodiment, the present invention is an electrical assembly which includes a clip that couples a thermal element to an integrated circuit package. The integrated circuit package is mounted to a printed circuit board. An elastomer is located between the printed circuit board and the clip. The assembly is designed so that the elastomer applies a pre-load force which pulls the thermal element into the integrated circuit package. The pre-load is typically set so that the thermal element does not become separated from the package when the assembly is subjected to external shock and vibration loads. The elastomer applies the pre-load force uniformly along the area of contact with the printed circuit board. The elastomer does not create localized high stress points on the board. Additionally, the elastomer has an inner opening that is larger than the outer dimensions of the integrated circuit package so that the elastomer applies the pre-load force onto the board in an area away from the solder joints of the package.

Figure 2:
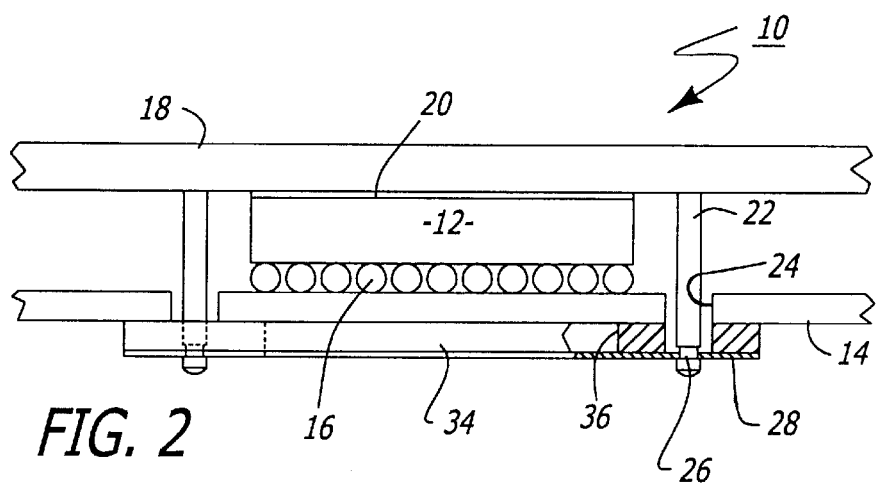
FIG. 2 is a side view of an electrical assembly of the present invention.
Figure 3:
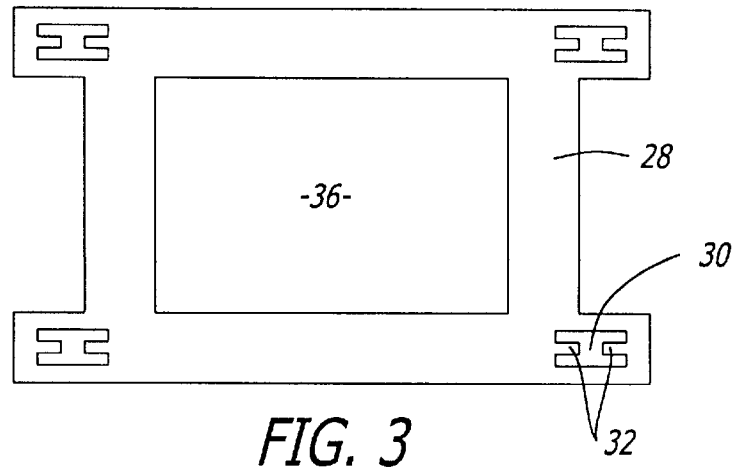
FIG. 3 is a bottom view of a clip of the present invention.

Referring to the drawings more particularly by reference numbers, FIGS. 2 and 3 show an electrical assembly 10 of the present invention. The assembly 10 includes an integrated circuit package 12 that is mounted to a printed circuit board 14. Internal to the package 12 is an integrated circuit (not shown) which is coupled to the circuit board 14 by a plurality of solder joints 16. The solder joints 16 may be arranged into a two dimensional array along the bottom surface of the package 12. The integrated circuit package 12 may be a package technology that is referred to as a plastic land grid array (PLGA). Although it is to be understood that other types of packages may be employed in the present invention.

The assembly 10 further includes a thermal element 18 that is coupled to the integrated circuit package 12. The thermal element 18 provides a conductive path for the heat generated by the integrated circuit within the package 12. The thermal element 18 may be a finned heat sink, heat pipe or other heat transfer medium.

The assembly 10 may contain a thermal grease 20 that is located between the thermal element 18 and the integrated circuit package 12. The thermal grease 20 lowers the thermal impedance of the package/thermal element interface.

The thermal element 18 has a plurality of pins 22 that extend through openings 24 in the printed circuit board 14. The pins 22 each have an annular groove 26. A clip 28 is attached to the pins 22 to couple the thermal element 18 to the integrated circuit package 12.

As shown in FIG. 3 the clip 28 has H shaped openings 30 which each have a pair of fingers 32. The fingers 32 snap into the grooves 26 when the pins 22 are pushed through the openings 30 of the clip 28. The clip 28 is typically constructed from a thin metal material so that the fingers 32 can be deflected and snapped into the grooves 26 without yielding the clip material.

Referring to FIG. 2, an elastomer 34 is located between the clip 28 and the printed circuit board 14. The assembly 10 is designed so that the elastomer 34 is in a deflected condition to exert a pre-load force on the clip 28. The pre-load pulls the thermal element 18 into the integrated circuit package 12. The pre-load is typically designed to be greater than typical shock or vibration loads that are applied by the assembly. The pre-loaded elastomer 34 prevents separation between the thermal element 18 and the package 12 during shock and vibration loading of the assembly 10.

Additionally, the elastomer 34 uniformly distributes the pre-load across the area of contact with the printed circuit board 14. The uniform force distribution prevents localized areas of high deflection and stress concentration in the circuit board 14. The elastomer 34 may be constructed from a silicon base sheet which has four through holes (not shown) which provides a clearance for the pins 22 of the thermal element 18.

Figure 1:
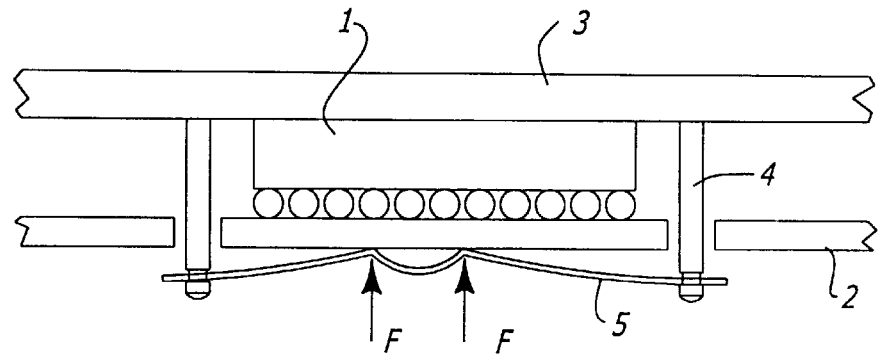
FIG. 1 is a side view of an electrical assembly of the prior art.

Referring to FIG. 3, the clip 28 and elastomer 34 have an inner opening 36. As shown in FIG. 2 the inner opening 36 is equal to the area of the solder joints 16. With such a configuration the elastomer 34 applies a pre-load onto the printed circuit board 14 which is evenly distributed on the board 14 under the solder joints. The load location and uniform force distribution of the elastomer 34 creates a package assembly that has lower solder joint stresses than the prior art assembly shown in FIG. 1. The reduction in stress increases the production yield and life of the package 12.

The assembly is assembled by initially soldering the integrated circuit package 12 to the printed circuit board 14. The thermal grease 20 is then applied to either the package 12 or the bottom surface of the thermal element 18. The pins 22 are inserted through the openings 24 of the printed circuit board 14.

The elastomer 34 is coupled to the clip 28 and the clip 28 is attached to the pins 22. The elastomer 34 may be bonded to the clip 28 before attachment to the pins 22. The dimensions of the package 12, board 14, pins 22, clip 28 and elastomer 34 are such that the elastomer 34 is deflected when the clip 28 is attached to the pins 22 to create the pre-load which pulls the thermal element 18 into the package 12.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. An electrical assembly, comprising:
   a printed circuit board which has a first side and a second side;
   an integrated circuit package that is mounted to said first side of said printed circuit board;
   a thermal element that is located adjacent to said integrated circuit package on said first side of said printed circuit board;
   a pin that extends from said thermal element through said printed circuit board;
   a clip that is attached to said pin to secure said thermal element to said printed circuit board; and,
   an elastomer that is located between said clip and said second side of said printed circuit board and which distributes a force on said printed circuit board beneath said integrated circuit.

2. The assembly as recited in claim 1, wherein said elastomer exerts a force that pulls said thermal element into said integrated circuit package.

3. The assembly as recited in claim 1, wherein said elastomer has an inner opening that is equal to an area of solder joints of said integrated circuit package.

4. The assembly as recited in claim 1, wherein said clip has a finger that extends into a groove of a pin of said thermal element.

5. The assembly as recited in claim 1, further comprising a thermal grease that is located between said integrated circuit package and said thermal element.

6. An electrical assembly, comprising:
   a printed circuit board that has a first side, a second side and a plurality of openings;
   an integrated circuit package that is mounted to said first side of said printed circuit board;
   a thermal element that is located adjacent to said integrated circuit package on said first side of said printed circuit board;
   a plurality of pins that extend from said thermal element, each pin extends through one of said openings of said printed circuit board;
   a clip that is attached to said pins to secure said thermal element to said printed circuit board; and,
   an elastomer that is located between said clip and said second side of said printed circuit board, said elastomer exerts a force which pulls said thermal element into said integrated circuit package and is distributed on said printed circuit board beneath said integrated circuit.

7. The assembly as recited in claim 6, wherein said elastomer has an inner opening that is larger than an outer dimension of said integrated circuit package.

8. The assembly as recited in claim 7, further comprising a thermal grease that is located between said integrated circuit package and said thermal element.

9. The assembly as recited in claim 8, wherein said clip has a plurality of fingers that extend into a plurality of grooves of said pins.

10. A method for coupling a thermal plate to an integrated circuit package that is mounted to a first side of a printed circuit board which also has a second side, comprising:
    a) inserting a pin of the thermal plate through an opening of the printed circuit board so that the thermal plate is adjacent to the integrated circuit on the first side of the printed circuit board; and,
    b) attaching a clip and an elastomer to the pin on the second side of the printed circuit board to secure the thermal plate to the printed circuit board so that the elastomer distributes a force on the printed circuit board beneath the integrated circuit.

11. The method as recited in claim 10, further comprising the step of inserting a thermal grease between the thermal element and the integrated circuit package before step (a).

* * * * *